United States Patent [19]

Ying et al.

[11] 3,980,994

[45] Sept. 14, 1976

[54] TEXT EDITING AND DISPLAY SYSTEM HAVING TEXT INSERT CAPABILITY

[75] Inventors: Charles W. Ying, Andover; Richard Ying, Brookline, both of Mass.

[73] Assignee: Atex, Incorporated, Bedford, Mass.

[22] Filed: Feb. 27, 1975

[21] Appl. No.: 553,750

[52] U.S. Cl. .......................................... 340/172.5
[51] Int. Cl.[2] ........................................ G06F 3/14
[58] Field of Search ............................... 340/172.5

[56] References Cited
UNITED STATES PATENTS

| | | | |
|---|---|---|---|
| 3,654,611 | 4/1972 | Bluethman et al. | 340/172.5 |
| 3,810,107 | 5/1974 | Goldman et al. | 340/172.5 |

*Primary Examiner*—Raulfe B. Zache
*Attorney, Agent, or Firm*—Cesari and McKenna

[57] ABSTRACT

A natural language text editing and display system having a central processing unit, a memory unit, and an input keyboard terminal. Display characters are selectively inserted into the text stored in the memory unit by actuating an insert key at the keyboard, positioning a cursor at the desired location on the display and actuating a key corresponding to a character to be inserted at that location. The terminal generates a character word having a character code corresponding to the selected display character and an insert code. The insert code identifies the associated character word as one to be inserted by the processing unit at the cursor location.

7 Claims, 4 Drawing Figures

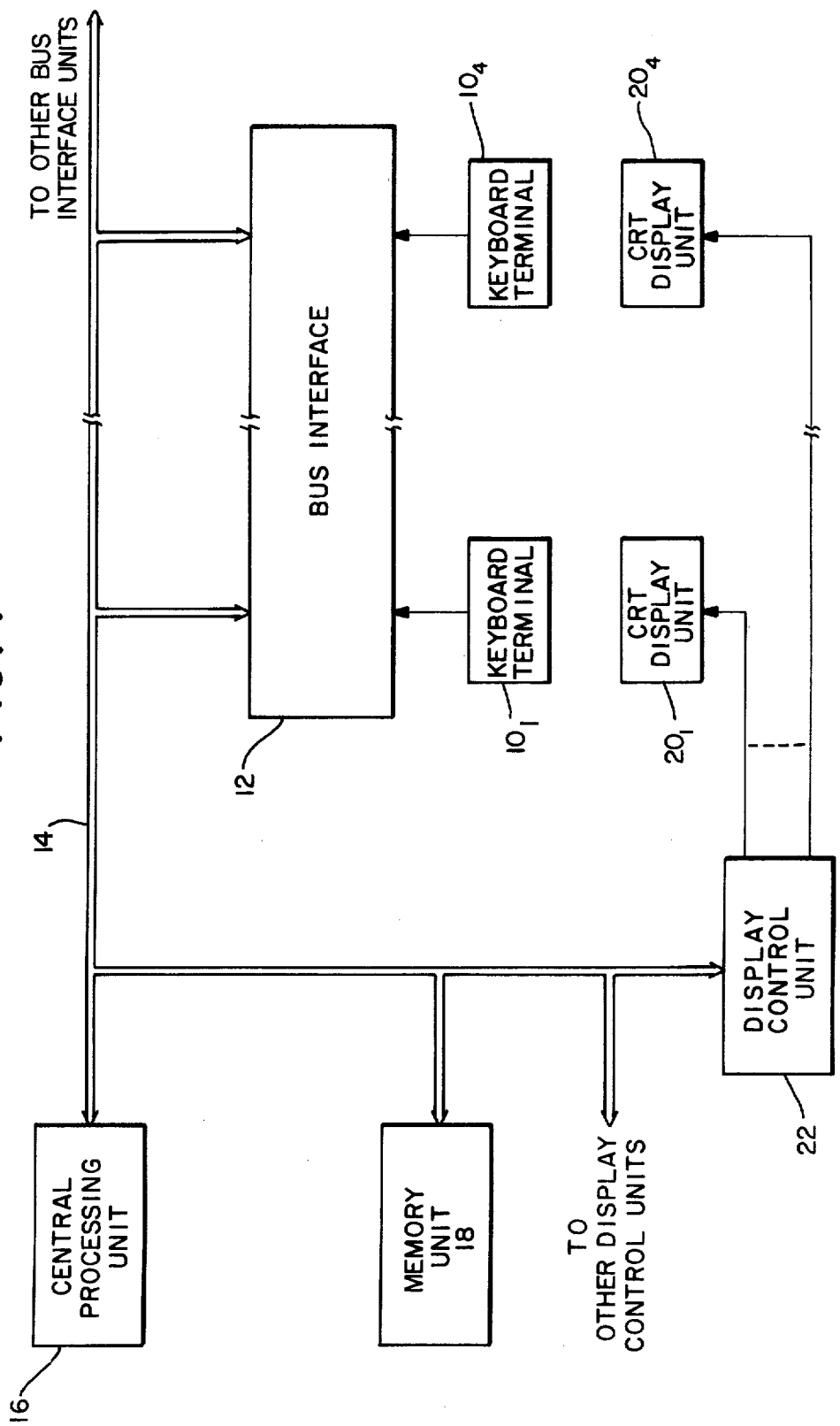

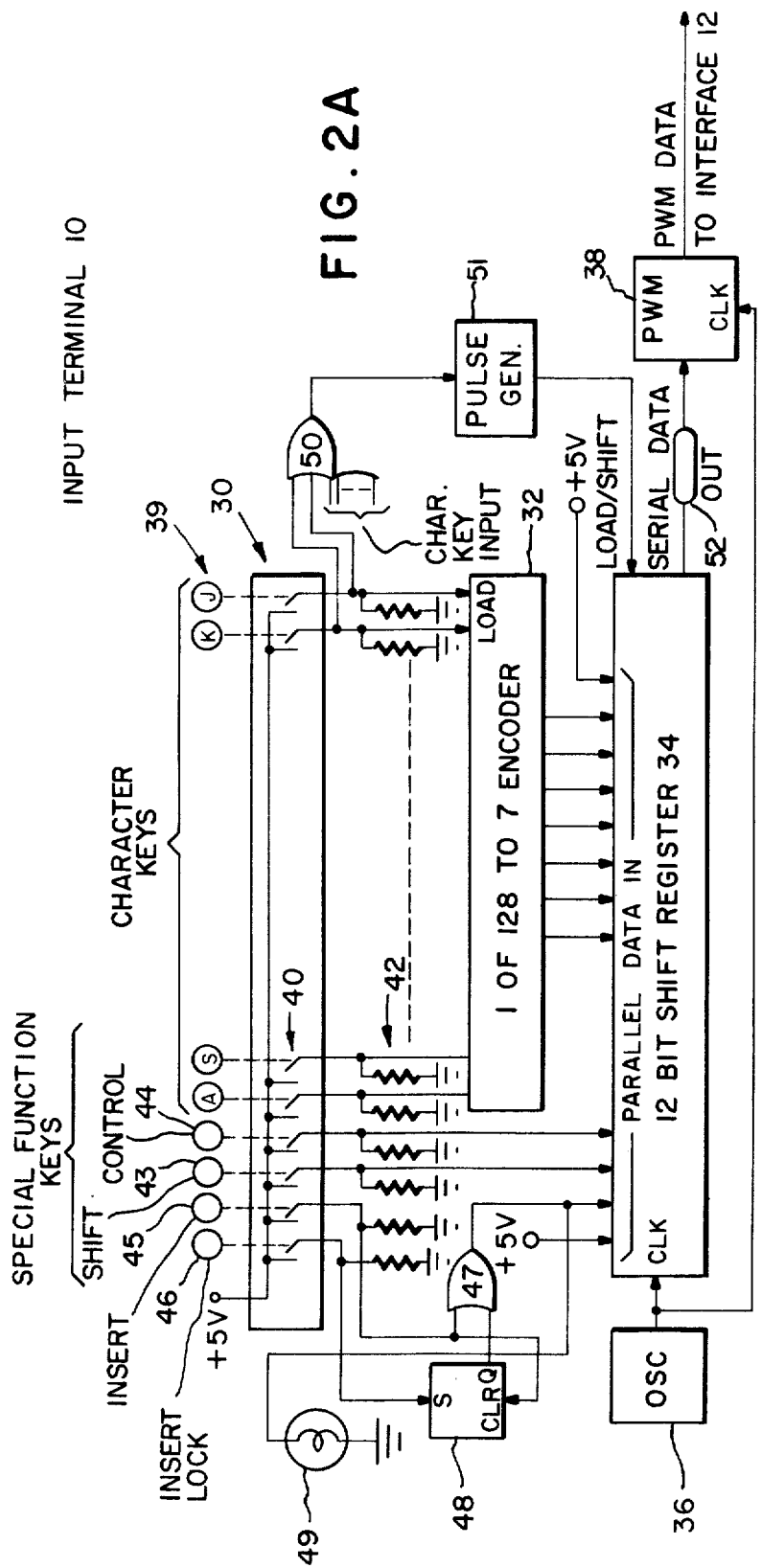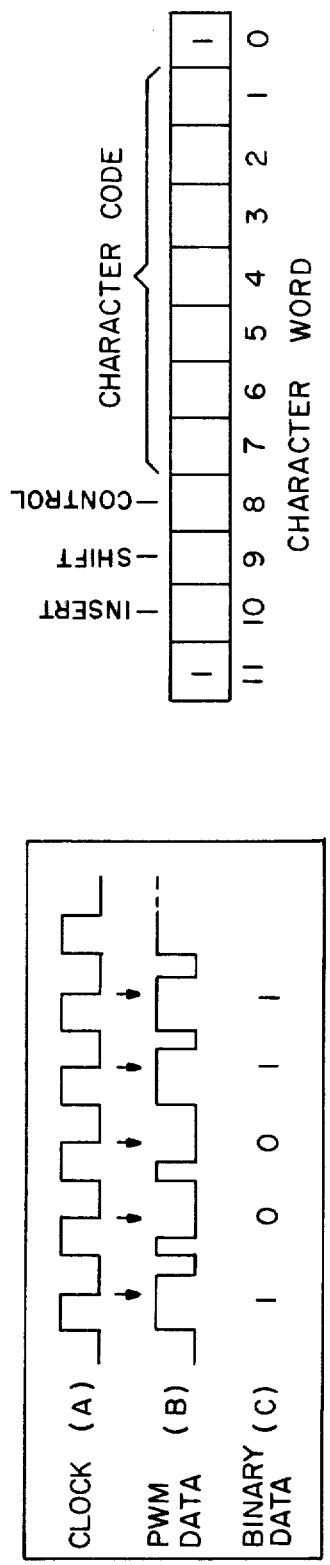

TEXT EDITING AND DISPLAY SYSTEM HAVING TEXT INSERT CAPABILITY

BACKGROUND OF THE INVENTION

1. Field of the Invention

This invention relates in general to a text editing and display system having input devices such as keyboards, for entering textual characters into the system, and a central processor unit and a memory unit for receiving and storing the display characters for subsequent display by a display unit, such as a cathode ray tube raster scan display. More specifically, it relates to such a system having the capability to insert display characters into the text stored in memory and thus also into the text displayed by an associated display unit.

2. Background

There are a number of text editing and display systems which, typically, include keyboard input terminals, cathode ray tube (CRT) display terminals, central processing units for controlling the systems and memory units for storing the display characters. An operator at each keyboard can enter display characters into such a system. Characters thus entered are stored in the memory unit by the processing unit and are retrieved from the memory unit by a control unit, which may be the processing unit, for display on the CRT screen. Such a system usually has the ability to insert display characters into the text stored in the memory unit.

For normal data entry, the keyboard operator positions a display cursor and "types" in the selected display character at the cursor location. The entered character "strikes over," or replaces, any character in that location. The operator initiates a text insert operation by positioning the cursor at the location of the desired insert and depressing a momentary or a locking "insert" key which generates an insert signal. This key may be mechanically identical to the "SHIFT" key used on standard office typewriters.

In prior systems, the terminal is thus enabled to transmit an insert signal to the central processing unit. In response, the central processing unit returns an acknowledgment signal to the keyboard which sets a latch to actuate a display device, such as a light, indicating to the operator that the system is now in the insert mode of operation. The operator then types one or more characters and, as each character is entered, the character under the cursor and all subsequent characters are moved to the right or to a subsequent line. One problem with systems of this type is that line noise between the processor and input terminal may erroneously establish or terminate an insert mode indication at the keyboard.

Thus, these prior character insert systems require that an "insert mode" be maintained between the processor and the keyboard terminal while the inserted characters are being entered. Consequently, the processor is required to check a "mode table" each time it receives a character to determine if the character is to be inserted or added normally into the text. Thus, the processor must perform an additional operation each time a character is entered, which complicates the software controlling the processor and increases processing time. In addition, bidirectional data must be transferred over the lines between the keyboard terminals and the central processor unit, adding a wire between the central processing unit and input terminal and causing further complexity at the terminal (e.g., command decoding circuitry).

It is an object of this invention to provide a text editing and display system which efficiently uses processor time.

Another object of the invention is to insert display characters into a stored text without establishing an insert mode between the remote keyboard and the central processor.

A further object of this invention is to insert display characters into previously stored text without requiring two-way communication between the central processing unit and the data terminal.

It is still a further object of this invention to provide a text editing and display system having an insert capability which is resistant to line noise problems.

SUMMARY OF THE INVENTION

In accordance with the above objectives we provide a text editing and display system having a keyboard unit which conventionally generates a code identifying each selected character. Additionally an insert key, when actuated, enters an INSERT code into a "character word" that also includes the code for the selected character. The central processor unit receives the character word and responds to the insert code by inserting the character into the memory unit at a predetermined location amidst the previously stored text. No additional signals are exchanged between the keyboard terminal and the central processor unit in order to insert the selected display characters into the stored text.

BRIEF DESCRIPTION OF THE DRAWINGS

FIG. 1 is a generalized block diagram of a text editing and display system incorporating the present invention;

FIG. 2A is a block schematic diagram of the keyboard terminal;

FIG. 2B is a timing diagram for data transmission from the input terminal;

FIG. 2C is a bit map of a character word as generated by the keyboard terminal.

DETAILED DESCRIPTION OF THE INVENTION

The subject of the disclosed invention may be more fully understood when viewed in the context of an overall text editing and display system incorporating the invention as shown in FIG. 1. The text editing system comprises several keyboard terminals 10 at which operators enter display characters into the system. The terminals 10 generate character words defining the selected display characters, which words are transmitted via a bus interface unit 12 onto a common bus 14 to a central processing unit (CPU) 16. The CPU 16 controls the entry of the character-defining words into a memory unit 18 such that characters consecutively entered from the terminals 10 are stored "close packed" and in sequence in the memory unit 18. In addition, the CPU 16 performs various text editing functions in response to instructions from the input terminals 10.

Advantageously, the CPU 16 is a KA11 processor included in the "PDP - 11" general purpose digital computer marketed by Digital Equipment Corporation, Maynard, Mass., U.S.A. This CPU includes a bus controller which, among other functions, monitors the bus 14 operations, assigns use of the bus to various devices connected to it in accordance with their assigned priority levels, and interrupts usage of the bus 14 by these devices when a device having a higher priority requests bus access. A more detailed description of the structure and operation of the common bus, and the characteristics of a central processing unit used with such a bus, is set forth in the "PDP - 11 Handbook" published by the Digital Equipment Corporation, Maynard, Massachusetts, 1971 edition, and is defined in U.S. Pat. No. 3,815,099 and the contents of those documents are expressly incorporated herein.

The CPU 16 may connect to the memory unit 18 or to a plurality of memory multiplexers (not shown) which each connect to one or more memory units as described in my co-pending patent application Ser. No. 508,358, which is hereby expressly incorporated herein. The bus 14 is advantageously connected to a plurality of CRT raster scan display units 20 by a display control unit 22. The display control unit 22 retrieves character words from the memory unit 18 and temporarily stores them for display by the CRT display units 20. The display control unit 22 also performs certain format control functions as described in my co-pending patent application Ser. No. 508,359, which is hereby expressly incorporated herein.

An operator at one of the keyboard terminals 10 enters display characters into the system and reviews them on a CRT display unit 20. For normal data entry, the operator positions a cursor by means of keyboard keys which move the cursor either up or down (from line to line) or right to left (along a given line). The cursor marks the location on the screen where the next display character will be entered. If the operator wishes to replace a character, he positions the cursor over the character and types in a new one. The new character "strikes over," or replaces, the old.

One editing function performed by the CPU 16 is a text insert operation. To insert text, the operator moves the display cursor to the point at which he wishes to begin inserting additional characters into the displayed text. The operator then presses a momentary or locking insert button and "types" in the characters which he wishes to insert. Then as each new character is entered into the display, it is inserted into the space containing the cursor. The character under the cursor, all subsequent text characters, and the cursor move to the right along the text line where the insert is taking place. If the insertion is sufficiently long that characters from its line must be located on a subsequent line, then all subsequent text is repositioned, as required, by the central processing unit 16 or, as described in patent application Ser. No. 508,359, the repositioning may be controlled by the display control unit 22.

The common bus 14 includes bidirectional address, control, and data lines and any unit connected to the bus, except the memory, can gain control of the bus and initiate a data transfer by exchanging a sequence of signals between itself and the CPU 16. Accordingly, the bus interface unit 12 shown in the present invention generates and receives the signals necessary for keyboard terminal 10 to transfer data over the bus 14 to the CPU 16.

The character words used in conjunction with the present invention are conveniently chosen to be sixteen bits so as to correspond with the word length of a "PDP - 11" data processing system. However, the character words may, of course, differ in length, especially if a different data processing system is used.

The character words from the keyboard contain identification, validation, and control bits in addition to the character identifying code in the word. These additional bits are useful to prevent erroneous data transmission and to control various computer operations; however, they do not provide display information. The processor deletes non-display-related information from the character words and, in its place, may insert desired display appearance codes, such as for bold face or blinking, into the character words before storing them in the memory unit.

In order to be compatible with the preferred bus arrangement, each unit connected to the bus 14 includes a data buffer register (DBR) and a control status register (CSR) which connect to the common bus 14 and which are addressable by any unit initiating a data transfer. The registers contain, respectively, the data to be transferred over the bus and various control and status data.

The parts of the keyboard terminal 10 pertinent to the present application are shown in detail in FIG. 2A. The terminal 10 includes a keyboard 30, an encoder 32, a shift register 34, an oscillator 36 and a pulse-width modulation circuit 38. The keyboard 30 in turn, includes a set of character keys 39, each key comprising a contact 40 which is normally held at ground potential by a pull-down resistor 42. Actuating a key 39 applies a positive voltage to its associated contact 40. To enter data, the operator actuates a character key 39 to provide a resulting input to encoder 32, which is a one-of-one hundred twenty eight to seven-bit encoder and whose output is a unique code for each input.

The coded output of encoder 32 provides seven parallel inputs to the shift register 34. Two special function keys (SHIFT KEY 43 and CONTROL KEY 44) provide inputs directly to register 34 so that when either of them is actuated together with a character key 39, it sets a corresponding bit in register 34. The INSERT key 45 and INSERT LOCK key 46 are used to identify an associated character as one to be inserted within the text.

The INSERT key 45 and INSERT LOCK key 46 are arranged to electronically set and clear the insert mode much as the SHIFT and SHIFT LOCK keys of a standard office typewriter mechanically set and clear the "SHIFT" operation. Thus actuation of the INSERT LOCK key 46 initiates and holds the insert mode after the key 46 is released, while actuation of the INSERT key 45 initiates the insert mode, but clears it when the key 45 is released. Actuation and releasing of the INSERT KEY 45 also clears the insert mode if it has been held by previous actuation of the INSERT LOCK key 46.

The contact of the INSERT key 45 provides an insert signal as an input to an OR circuit 47 whose output sets an insert bit in register 34 and energizes a lamp 49. The key 45 output also clears a flip-flop 48 which is set by an insert-lock signal which is generated when the INSERT LOCK key 46 is actuated. The Q output of flip-flop 48 provides a second input to OR circuit 47. Finally, a leading bit and trailing bit are set into register 34 whenever a key 39 is actuated.

To perform an insert operation, if the insertion is brief, the operator depresses the INSERT key, which sets the insert bit in register 34, and he simultaneously types in the inserted characters. To insert a more lengthy passage, the operator actuates the INSERT LOCK key, thereby setting flip-flop 48, which in turn continuously sets the insert bit in register 34. At the end of the insertion, the operator terminates the INSERT LOCK mode by actuating the INSERT key to clear flip-flop 48. The lamp 49 indicates whether the keyboard terminal 10 is inserting characters into the system.

A bit map of a resultant character word entered into register 34 is shown in FIG. 2C. Bits 0 and 11 are the leading and trailing ONE's which frame the character word. Bits 1 through 7 are the character codes; bit 8 is an optional control bit; bit 9 indicates the shift mode and, bit 10 indicates the insert mode. The SHIFT key causes the upper case character on a key to be entered. Thus the insert code from the keyboard is communicated to the processor as a portion of the character word for each character to be inserted. Finally, the CONTROL key is available to optionally include a variety of other attributes in the selected characters.

Referring again to FIG. 2A, the oscillator 36 provides a clock input to the shift register 34. Normally, i.e. when no character has been entered into it, register 34 shifts out a ZERO with each clock input. Each of the keys 39 provides an input to an OR circuit 50 whose output passes through a one-shot pulse generator 51 as a LOAD input to register 34, which thereupon enters data from the encoder 32 into the register. Actuating one of the keys 39 thus enters the coded output of encoder 32, the leading and trailing ONE's and any special function bits into the register 34. Oscillator 36 then serially shifts the data out of register 34, through delay 52 and to the pulse-width modulation circuit 38. The output of oscillator 36 also clocks the character word bits into modulation circuit 38. If a ZERO is present at the input to the modulator circuit 38, the modulator generates a square wave output having a 25% duty cycle and in phase with the clock signal. Conversely, a ONE input to the modulator produces an in phase square wave output having a 75% duty cycle. The output of modulator 38 thereby provides a serial data input to the bus interface 12. The pulse-width modulated data is received asynchronously and converted into binary information by conventional techniques.

The interface 12 may be located a substantial distance from the keyboard, e.g., at the central site near the CPU 16, and therefore it is advantageous to be able to transmit data over a single pair of wires as in the present case. The present invention facilitates this feature by obviating the need for an additional insert acknowledgment line as was required by the prior art.

The bus interface unit 12 receives the character word and, after receiving a complete word as identified by the ONE's framing the word, initiates the processor interrupt signal sequence. After the CPU 16 has granted the interrupt request and read the contents of the CSR and DBR it either enters or inserts the character word into the memory unit.

If a character is to be inserted, the CPU 16 responds to the insert code in the character word by initiating any one of a number of insert routines known in the art by which the inserted character word is loaded into the memory unit at the cursor location and the addresses (or pointers to those addresses) of all subsequent text words stored in the memory unit are incremented. Thus, the display character under the cursor and all subsequent display characters are moved to the right or down to a subsequent line to make room for the inserted characters.

We claim:

1. A text editing and display system having an input terminal for entering display characters into the system, a central processing unit, and a memory unit, the input terminal, central processing unit and memory unit connected for enabling data transfers, said system including:
   A. input means at the input terminal for generating character words, each character word including a character code defining a selected display character and an insert code indicating whether or not the character is to be inserted into the text,
   B. means for transmitting each character word to the central processing unit, whereby the central processing unit utilizes the insert code to selectively initiate an insert routine by which a code representing the display character is entered into the memory unit at a selected location and the addresses of adjacent display characters are altered accordingly.

2. A text editing and display system as defined in claim 1 wherein said input terminal is a keyboard including an insert key for generating an insert signal for setting the insert code.

3. A text editing and display system as defined in claim 2 including:
   A. an insert lock key actuable for generating an insert lock signal,
   B. latching means:
      i. connecting to said insert lock key to receive the insert lock signal and responding thereto by setting the insert code and,
      ii. connecting to said insert key to receive the insert signal and responding thereto by terminating the latched insert code.

4. An input terminal for use with a text editing and display system having a central processing unit and, a memory unit, the input terminal, central processing unit and memory unit connected for enabling data transfers, said input terminal operable to enter display characters into the display system and including:
   A. input means at the input terminal for generating character words, each character word including a character code defining a selected display character and an insert code indicating whether or not the character is to be inserted into text.
   B. means for transmitting each character word to the central processor whereby the central processor utilizes the insert code to selectively initiate an insert routine by which a code representing the display character is entered into the memory unit at the selected memory location and the addresses of adjacent display characters are altered accordingly.

5. An input terminal as defined in claim 4 wherein the input terminal is a keyboard including an insert key for generating an insert signal for setting the insert code.

6. An input terminal as defined in claim 5 including:
   A. an insert lock key for generating an insert lock signal,
   B. latching means responsive to the insert lock signal for setting the insert code and responsive to the insert signal for terminating the locked insert code.

7. An input terminal as defined in claim 3 including display means for receiving the insert code and responding thereto by generating a visual signal.

* * * * *